(12) United States Patent
Evans

(10) Patent No.: US 6,556,629 B1
(45) Date of Patent: Apr. 29, 2003

(54) ORTHOGONAL SIGNAL TRANSMITTER

(75) Inventor: David H. Evans, Crawley (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/360,218

(22) Filed: Jul. 23, 1999

(30) Foreign Application Priority Data

Aug. 4, 1998 (GB) ............................................. 9816820

(51) Int. Cl.[7] .................................................. H04K 1/02
(52) U.S. Cl. ......................................................... 375/297
(58) Field of Search ................................. 375/297, 260, 375/279, 283, 295, 302, 377, 285; 348/388, 398; 330/254, 278, 121

(56) References Cited

U.S. PATENT DOCUMENTS

| | | | |
|---|---|---|---|
| 5,610,908 A | 3/1997 | Shelswell et al. | 370/210 |
| 5,636,247 A | 6/1997 | Kamerman et al. | 375/260 |
| 6,130,918 A | * 10/2000 | Humphrey et al. | 375/285 |

FOREIGN PATENT DOCUMENTS

| | | | |
|---|---|---|---|
| EP | 0431201 A1 | 6/1991 | H04B/1/04 |
| EP | 0926815 A1 | 6/1999 | H03F/1/04 |

* cited by examiner

*Primary Examiner*—Khai Tran

(57) ABSTRACT

A transmitter for transmitting orthogonal signals comprises a power amplifier (112) having a transfer characteristic in which gain is substantially independent of applied bias voltage. A digital signal for transmission is monitored by a level detector (116) which determines the peak output power required from the power amplifier (112). This information is used by a power supply controller (122) to control the DC bias voltage applied to the power amplifier (112) so that the applied voltage is reduced for low signal levels and increased for high signal levels, thereby increasing the efficiency with which supplied power is converted to radiated power. The applied voltage may be changed for each output symbol, or may be continuously adapted to track the peak envelope power. This method of controlling the amplifier (112) may be used in conjunction with coding schemes for reducing the peak to mean power ratio.

9 Claims, 1 Drawing Sheet

ORTHOGONAL SIGNAL TRANSMITTER

The present invention relates to a transmitter for transmitting orthogonal signals, comprising a power amplifier having a transfer characteristic in which gain is substantially independent of applied bias voltage. In the present specification the term transmitter is to be understood to cover a transmitter forming part of a transceiver. Also, while the present specification describes a transmitter for an Orthogonal Frequency Domain Multiplexing (OFDM) system, it is to be understood that such techniques are equally applicable to other systems transmitting orthogonal signals, for example Code Division Multiple Access (CDMA).

BACKGROUND OF THE INVENTION

OFDM, also known as MultiCarrier Modulation (MCM) or Discrete MultiTone modulation (DMT), is a technique by which data is transmitted at a high rate by modulating several low bit rate carriers in parallel, rather than one high bit rate carrier. OFDM is spectrally efficient, and has been shown to be effective for high performance digital radio links. Application areas include: Wireless Asynchronous Transfer Mode (WATM), for high speed, short distance radio links between computer systems; Digital Audio Broadcasting (DAB), for high quality audio signals; Microwave Video Distribution System (MVDS); and future mobile radio systems such as Universal Mobile Telecommunication System (UMTS).

An important characteristic of a Radio Frequency (RF) signal for transmission is the crest factor, defined as the ratio of the peak value of an AC waveform to its Root Mean Square (RMS) value. In an OFDM system the crest factor can be high since it is possible for the signals in each of the sub-channels to be in phase (giving rise to a peak value that is the product of the number of channels and the amplitude of the signal in each channel), but on average the phases will be randomly distributed (giving rise to a much lower mean value). For example, in a 16 carrier OFDM system the peak power can be 16 times the mean transmission power.

The need to be able to transmit signals with such a high crest factor places considerable design constraints on the transmitter's power amplifier, in particular its linearity to meet requirements for permissible levels of compression and clipping. Generally such an amplifier has a poor DC to RF power conversion efficiency which may result in the generation of excessive amounts of heat and which also has a detrimental effect on battery life if the amplifier is incorporated in portable equipment.

The crest factor can be reduced by preventing the combination of certain phase modulation states from being applied to the carriers. However, this has the disadvantage that more symbols need to be transmitted for a given amount of data as each symbol has fewer available states. Such techniques are well known, one example being a ¾ rate scheme for a four carrier OFDM system, which reduces the crest factor from 4 to 1.9. U.S. Pat. No. 5,636,247 describes a more sophisticated technique of this type. When applied to a 16 channel system a crest factor reduction of 3 dB can be achieved using a 13/16 rate scheme.

An alternative method is described in U.S. Pat. No. 5,610,908, in which a number of closely spaced carriers are modulated (in this case using QPSK) and then transformed to the time domain by an Inverse Fast Fourier Transform (IFFT), as is usual. The signals are then limited and transformed back to the frequency domain by a Fast Fourier Transform (FFT) where phase and amplitude adjustments may be made to some of the signals, and then transformed back to the time domain with an IFFT. From here the transmission proceeds as normal. An example is given of a 2048 channel OFDM system for which a simulation of twenty random signals, initially having a crest factor of 9.38 dB, demonstrated that the crest factor could be reduced to 3.4 dB.

It can be seen that although the techniques outlined above can reduce the crest factor they cannot reduce it to unity (corresponding to a constant envelope modulation). Hence, there are still significant constraints on the design of power amplifiers for use in OFDM systems which limit the efficiency of DC to RF power conversion.

SUMMARY OF THE INVENTION

An object of the present invention is to maximise the DC to RF power conversion efficiency of an orthogonal signal transmitter.

According to the present invention there is provided a transmitter for transmitting orthogonal signals, comprising a power amplifier having a transfer characteristic in which gain is substantially independent of applied bias voltage, means for determining the maximum crest factor in an interval of a signal to be transmitted and means for varying the DC bias voltage applied to the amplifier in response to the determined crest factor of the signal.

A known method by which the efficiency of a power amplifier that is subject to varying power levels can be improved is to vary the DC bias conditions to suit the applied signal level. If the signal level is low a low bias voltage is applied, while if the signal level is high a high bias voltage is applied. Providing the gain of the amplifier is invariant, little or no distortion should occur. This can either be done by switching between different supply voltage levels depending on the signal amplitude (the resulting amplifier being known as a class G amplifier), or by amplitude modulating the supply voltage to keep it at a level which is just sufficient to amplify the instantaneous peak signal level without distortion (the resulting amplifier being known as a class H amplifier).

The present invention is based upon the recognition, not present in the prior art, that in a transmitter including a power amplifier having the characteristic of substantially constant gain irrespective of applied DC bias voltage, the bias voltage of the amplifier can be controlled with reference to the crest factor of a signal to be transmitted to improve the DC to RF power conversion efficiency of the transmitter.

Figure 1:
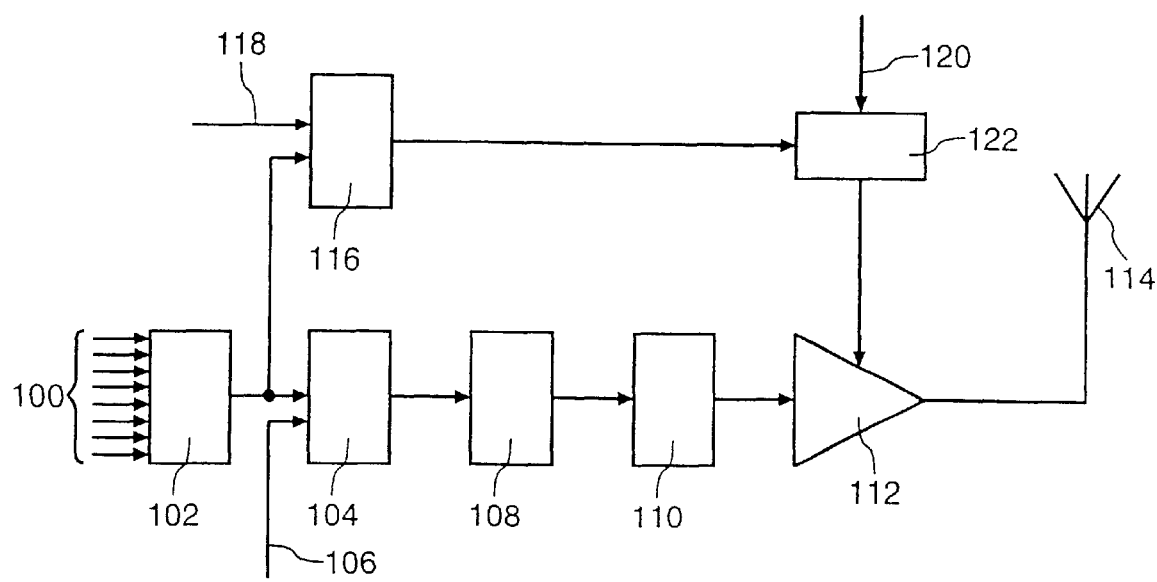
FIG. 1 is a block diagram of a transmitter in accordance with one embodiment of the present invention.

An embodiment of the present invention will now be described, by way of example, with reference to the single Figure of the accompanying drawing, which Figure is a block schematic diagram of an embodiment of a transmitter made in accordance with the present invention.

The illustrated transmitter typically forms part of a wireless communication transceiver, for example a WATM station. A number of parallel coded and modulated OFDM symbol streams 100 is supplied to an IFFT block 102, which combines the data into a serial data stream that will produce the corresponding number of OFDM carriers on transmission. Any known technique for crest factor reduction, such as those described above, may be used in the generation of these symbol streams. For reasons of clarity only eight input symbol streams are shown in the Figure, but the number present in practice will be determined by the system in which the transmitter will be used. At the output of the IFFT block the mean voltage level is known. For example in a WATM system having 16 carriers of peak amplitude 1.0V the average power is 8 watts, equivalent to a mean voltage of 2.83V across a 1 ohm resistor.

The serial data stream output by the IFFT block 102 is optionally passed through a digital clipping block 104, which has its clipping level set by a control signal 106. For example, the clipping level could be set to twice the mean voltage. Such a block is simple to implement compared to the other crest factor reduction techniques described above, but does have the disadvantage of degrading the bit error rate for a given signal to noise ratio. The data is then passed through a digital to analogue converter 108 and mixed onto an RF carrier signal for transmission by an up-conversion block 110. The RF signal is provided as input to an RF power amplifier 112 having the characteristic of substantially constant gain irrespective of applied DC voltage, which amplifies it to the required level for transmission by an antenna 114.

A level detector 116 monitors the serial data stream at the output from the IFFT block 102 and compares the required power with a set level 118. A DC power supply line 120 is provided as input to a power supply controller 122, which controller also monitors the output of the level detector 116. For an RF power amplifier 112 comprising a FET (or bipolar transistor), the power supply controller 122 supplies the required drain and gate bias voltages (or collector voltage and base bias current) to the amplifier 112. The power supply controller 122 could, for example, begin increasing the supply voltage (above a nominal level) when the waveform is 1.4 times the mean voltage to allow the amplifier to handle the peaks at 2 times the mean value.

For a FET amplifier, both drain and gate bias would need to be changed to maintain symmetrical clipping, and hence linearity. The device $V_{ds}$ would typically be changed from 5 to 7V, with a similar change in $I_{ds}$ in response to a change in applied gate voltage. The impedance matching of an RF amplifier is usually optimised for a given drain and gate bias (in the case of a FET amplifier). However, the relatively small changes in bias voltage and current proposed should not have a serious effect on the match. If the digital clipping block 104 were not present, the gate and drain bias voltages would have to be changed over a wider range to accommodate the higher crest factor of the signal to be transmitted.

For a 16 carrier system running at 25 Mbit/s (such as WATM), the symbol duration may be 1 µs. There may be up to 10 waveform peaks per symbol that exceed 1.4 times the mean voltage level, each of duration less than 0.05 ns. This imposes significant design constraints on the power supply controller 122, which has to respond to these signals.

Hence, as an alternative, the power supply controller 122 may set the supply voltage once per OFDM symbol depending on the peak crest factor within the symbol. This peak crest factor can be determined by a code generation block (not shown), using knowledge of the symbols to be transmitted on each OFDM carrier and the modulation scheme to be employed for transmission. Such an embodiment would provide less of an improvement in DC to RF power conversion efficiency, and would only be of benefit if no digital clipping block 104 were present.

From reading the present disclosure, other modifications will be apparent to persons skilled in the art. Such modifications may involve other features which are already known in orthogonal signal transmitters, and which may be used instead of or in addition to features already described herein.

In the present specification and claims the word "a" or "an" preceding an element does not exclude the presence of a plurality of such elements. Further, the word "comprising" does not exclude the presence of other elements or steps than those listed.

The present invention is applicable to a wide range of systems requiring the transmission of orthogonal signals, including WATM, DAB, MVDS and UMTS.

What is claimed is:

1. A transmitter for transmitting orthogonal signals, comprising a power amplifier having a transfer characteristic in which gain is substantially independent of applied bias voltage, means for determining the maximum crest factor in an interval of a signal to be transmitted and means for varying the DC bias voltage applied to the amplifier in response to the determined crest factor of the signal.

2. A transmitter as claimed in claim 1, wherein an input to the transmitter comprises a digital signal, characterised in that the transmitter further comprises means for clipping the digital signal to be transmitted.

3. A transmitter as claimed in claim 1, characterised in that the means for varying the DC bias voltage has a transfer characteristic which enables the DC bias voltage to be adjusted in response to the instantaneous peak envelope power of the signal.

4. A transmitter as claimed in claim 1, characterised in that the means for varying the DC bias voltage is controlled to adjust the DC bias voltage in response to the peak envelope power of an output symbol during the period of that symbol.

5. A transmitter as claimed in claim 1, characterised in that the means for varying the DC bias voltage varies the voltage in steps.

6. A transmitter as claimed in claim 1, characterised in that the means for varying the DC bias voltage varies the voltage continuously to track the peak envelope power.

7. A transmitter for transmitting orthogonal signals, comprising:

a power amplifier;

a level detector arranged to monitor a crest factor of a data steam; and a power supply controller connected to an output of the level detector and to a control input of the power amplifier;

wherein the power supply controller varies a control signal supplied to the control input in response to a determined crest factor.

8. The transmitter according to claim 7, wherein the power amplifier includes a FET.

9. The transmitter according to claim 8, further comprising an antenna connected to an output of the power amplifier.

* * * * *